United States Patent

Smithers

[11] Patent Number: 5,138,524
[45] Date of Patent: Aug. 11, 1992

[54] APPARATUS FOR SECURING ELECTRONIC DEVICE PACKAGES TO HEAT SINKS

[75] Inventor: Matthew C. Smithers, Lewisville, Tex.

[73] Assignee: Thermalloy Incorporated, Dallas, Tex.

[21] Appl. No.: 762,377

[22] Filed: Sep. 19, 1991

[51] Int. Cl.$^5$ ............................................. H05K 7/20
[52] U.S. Cl. .................................. 361/386; 24/458; 174/16.3; 267/150; 411/516
[58] Field of Search ................... 357/81; 174/16.3; 165/80.2, 80.3, 185; 361/383, 386–389, 417, 419, 420, 427; 248/505; 411/352, 500–528, 904; 267/150, 160; 24/295, 457, 458, 573, 625

[56] References Cited

U.S. PATENT DOCUMENTS

| | | | |
|---|---|---|---|
| 4,710,852 | 12/1987 | Keen | 361/386 |
| 4,716,494 | 12/1987 | Bright et al. | 361/386 |
| 4,964,198 | 10/1990 | McCarthy | 24/458 |
| 4,972,294 | 11/1990 | Moses, Jr. et al. | 361/386 |
| 5,031,028 | 7/1991 | Galich et al. | 174/16.3 |
| 5,068,764 | 11/1991 | Bland | 361/386 |

Primary Examiner—Gerald P. Tolin
Attorney, Agent, or Firm—Jack A. Kanz

[57] ABSTRACT

An elongated unitary clip apparatus having an S-shaped mid-section connecting end portions which extend in opposite directions from the mid-section is mounted within an aperture in a support base so that one end of the apparatus extends substantially parallel with one face of the support base and the opposite end extends substantially parallel with the opposite face. One end of the clip apparauts is secured in a second aperture in the support base and the opposite end urges an electronic device package into contact with a heat sink.

12 Claims, 1 Drawing Sheet

APPARATUS FOR SECURING ELECTRONIC DEVICE PACKAGES TO HEAT SINKS

This invention relates generally to electronic component assemblies. More particularly, it relates to apparatus for mounting electronic device packages on heat sinks, assembly chassis and the like.

BACKGROUND OF THE INVENTION

Most electronic devices generate thermal energy. Some such devices, depending on size, packaging, use, etc., generate so much heat that the device itself may be damaged or operate improperly unless excess thermal energy is removed during operation.

Heat sinks of various forms are conventionally used to protect electronic devices from excess heat. Heat sinks, of course, take many forms. Normally they are adapted to absorb and/or dissipate thermal energy into the surrounding environment. For purposes of this disclosure, a heat sink is any body of metal or like material which is placed in contact with an electronic device package for transferring heat from the device contained in the device package into the atmosphere by conduction, convection and/or radiation.

Heat sinks are commonly glued or otherwise adhesively attached to electronic device packages. However, adhesive assembly of the heat sink to the electronic device package is messy, tedious, labor intensive and requires accurate alignment of the parts. It is therefore expensive. Furthermore, many commonly used adhesives emit fumes or otherwise constitute an undesirable health hazard. Frequently, it is necessary to cure the adhesive at elevated temperatures for extended periods of time, further increasing manufacturing costs.

It is sometimes necessary and/or desirable to remove the electronic device package from the heat sink for repair or replacement. This is, of course, difficult or impossible to accomplish when the heat sink is adhesively secured to the electronic device package.

Heat sinks may also be mechanically attached to electronic device packages using screws, bolts, rivets or the like as well as by using resilient metal clips or the like mounted on the heat sink which urge the heat sink and the electronic device package into mutual contact. The resilient clip enables the heat sink to be easily removed from the electronic device package. However, this approach is sometimes undesirable in several respects. For example, where the clip forms part of the heat sink, different heat sinks must be formed to accept different device packages. However, various heat sinks are acceptable for dissipating thermal energy from various different device packages. The limiting use of the heat sink, however, may be the size, shape, etc., of the clip. Furthermore, most clips designed for attaching electronic device packages to heat sinks are secured in a fixed relationship so that substantial force must be used to insert the device package between the clip and the heat sink body. Ordinarily, this involves use of special tools or the like which not only increase the time and effort required to assemble an electronic device package on a heat sink, the force applied to the electronic device package during assembly may cause damage to the device package or the electronic device itself. It is, therefore, desirable that a mounting clip be provided which may be used in connection with various heat sinks and various electronic device packages so that mounting clips of various sizes and shapes may be used interchangeably with heat sinks of various sizes and shapes. Furthermore, it is also highly desirable that mounting clips for attaching electronic devices to heat sinks be operable to permit assembly and mounting of electronic device packages on heat sinks without use of special tools or the like. Instead, it is desirable that such devices be available so that device packages can be quickly and conveniently attached to heat sinks using nothing more than pressure applied directly to the clip or mounting device by hand or with simple tools. It is also desirable that mounting of electronic device packages on heat sinks be accomplished without the danger of causing damage to the device or device package during the assembly process.

SUMMARY OF THE INVENTION

The present invention provides apparatus for attaching an electronic device package to a heat sink. The attachment apparatus comprises a unitary elongated body which has a first end and a second end connected by a central section which defines a substantially S-shaped curve. The S-shaped curve is adapted to extend through an aperture in a heat sink, chassis or the like so that one end of the attachment apparatus extends in a first direction substantially parallel with one face of the heat sink and the other end extends in the opposite direction substantially parallel with and spaced from the opposite face of the heat sink, chassis or the like to define an attachment clip. The first end of the attachment apparatus is bent and adapted to extend into a second aperture in the heat sink, chassis or the like and the opposite end is adapted to mate with and secure an electronic device package between that end and the face of the heat sink with which it is aligned. The clip apparatus is adapted to pivot about the S-shaped midportion so that it may be readily inserted within the first aperture and maintained therein while a electronic device package is positioned between the second end and the mounting surface of the heat sink or the like. The device package is then secured to the heat sink by forcing the first end of the clip into the second aperture. The first end of the attachment apparatus has latching means such as barbs or the like which secure it within the second aperture in the heat sink so that the latching end is firmly secured within the heat sink and the opposite end of the clip apparatus is drawn toward the heat sink so as to secure the electronic device package adjacent the heat sink.

Since the mounting apparatus pivots about its S-shaped mid-section, an electronic device package may be inserted in the appropriate position between the clip end and the heat sink without applying undue pressure to the device package. Thereafter, the device package is urged in to secure contact with the heat sink by applying pressure on the opposite end of the mounting apparatus. Accordingly, the apparatus of the invention advantageously permits the attachment of electronic device packages to heat sinks without use of special tools or the like. Furthermore, the heat sink may be attached by simply applying pressure by means such as a human hand or the like. Furthermore, since the device package is inserted without applying pressure thereto, the likelihood of causing damage to the device package during assembly is substantially reduced.

BRIEF DESCRIPTION OF THE DRAWINGS

Other features and advantages of the invention will become more readily understood from the following detailed description taken in connection with the appended claims and attached drawing in which:

DETAILED DESCRIPTION OF THE INVENTION

Figure 1:
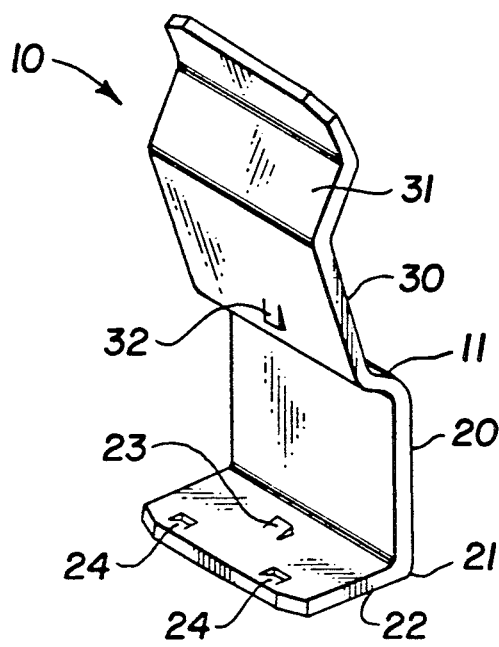
FIG. 1 is a perspective view of a preferred embodiment of attachment apparatus embodying the principles of the invention.

As illustrated in FIG. 1, the preferred embodiment of the invention comprises a unitary body 10 which is substantially rigid and elongated. Since the body 10 will act as a spring clip, it can be made from any substantially rigid but resilient material such as steel, aluminum or metal alloys. Where the electronic device package is to be electrically isolated from the heat sink, the body 10 may be made from suitable non-conductive materials such as plastic or the like or may be provided with an appropriate insulating coating (not shown).

The body 10 comprises a first end portion 20 and a second end portion 30 joined by a central portion 11. The central portion 11 is substantially S-shaped and the extreme end of first end portion 20 includes a bend 21 defining a latching end 22 which projects in the same general direction as the center section of the S-shaped central portion 11. The opposite end portion 30 curved to define a segment 31 adapted to contact and urge an electronic device package into intimate thermal contact with an appropriate heat sink.

The apparatus thus comprises an elongated body with first and second end portions which extend in opposite directions connected by an S-shaped central section which supports the end portions in different but substantially parallel planes.

Figure 2:
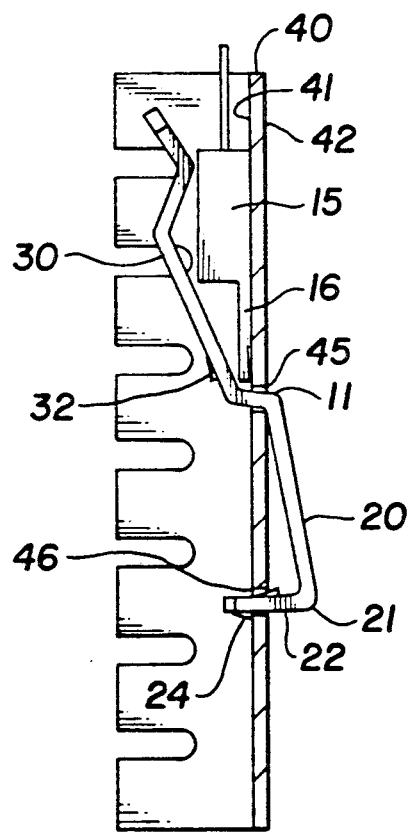
FIG. 2 is a side view of the attachment apparatus of FIG. 1 positioned within a heat sink shown in sectional view.
Figure 3:
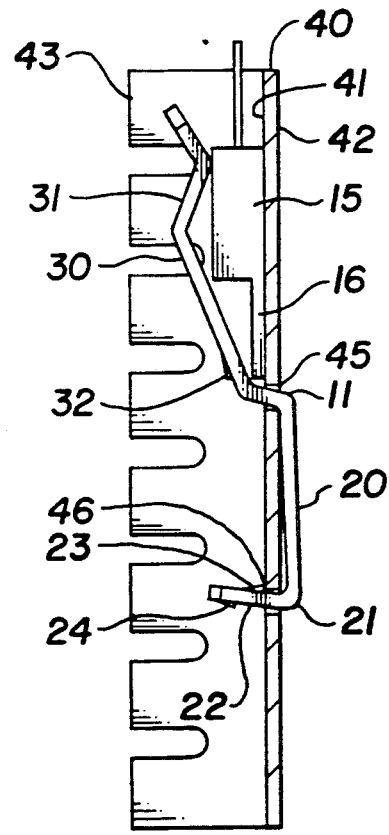
FIG. 3 is a side view of the attachment apparatus of FIG. 2 showing the attachment apparatus in the secured position.

FIG. 2 illustrates the apparatus of FIG. 1 in the open position as inserted into a heat sink. FIG. 3 illustrates the device of FIG. 1 in a closed position securing an electronic device package to the heat sink of FIG. 2. In the arrangement illustrated, the heat sink comprises a substantially flat support base 40 having oppositely disposed substantially parallel faces 41 and 42 with fins 43 projecting from face 41. It will be readily recognized, however, that the configuration of the heat sink is immaterial to the invention. The clip apparatus is configured to be assembled on a support base 40 which has a first aperture 45 and a second aperture 46 arranged and adapted to receive the body 10. The support base 40 may, of course, form part of the heat sink as illustrated. Alternatively, the support base 40 may be secured in a fixed position with respect to a heat sink to which the device package is to be secured by the clip end 30 of body 10.

The length of first end portion 20 is determined by the distance separating apertures 45 and 46 ( or vice versa) so that when the central portion 11 is fitted within first aperture 45, the latching end 22 extending from bend 21 is aligned with aperture 46.

In the preferred embodiment, latching end 22 includes retaining bosses such as barbs 23 and 24 extending therefrom. In the embodiment illustrated, barbs 23 and 24 extend from opposite faces of latching end 22. However, the positions of the barbs may be reversed or both sets of barbs may extend from the same face. Barbs 23 are positioned between the free end of latching end 22 and bend 21. Barbs 24 are positioned between the extreme free end and barbs 23. Another boss (illustrated as barb 32) is positioned on the second end portion 30 near the S-shaped central portion 11.

It will be recognized that the advantages of the invention include the ability to use various designs of clip bodies 10 in connection with a wide variety of heat sinks. Thus, various heat sink designs may be manufactured with appropriate apertures 45 and 46 therein, but clip bodies 10 may only be inserted into heat sinks when required. Accordingly, on some occasions clip bodies 10 will be inserted into heat sinks prior to shipment of the assembly from place of manufacture or assembly to the place where the device package is inserted. Accordingly, barbs 24 and 32 are provided to prevent accidental removal of the clip body from the heat sink during shipment and handling of the heat sink and clip assembly prior to insertion of the device package thereinto. Boss 32 prevents the body 10 from escaping from aperture 45 when the latching end 22 has not been inserted into aperture 46. Boss 24, which is near the extreme end of latching end 22, permits the assembly to be positioned for acceptance of a device package as illustrated in FIG. 2.

As illustrated in FIG. 2 the body 10 is first inserted into aperture 45 and arranged so that the central portion 11 is positioned in aperture 45 and latching end 22 aligned with aperture 46. The elongated body is then pivoted about central portion 11 until latching end 22 enters aperture 46. Barb 24 extends outwardly from latching end 22 sufficiently to permit latching end 22 to readily enter aperture 46 but prevent unintentional removal of latching end 22 therefrom. In this position (as shown in FIG. 2) the second end portion 30 extends substantially parallel with but spaced from face 41 of base 40. A semiconductor device package 15 may then be inserted between face 41 and second end portion 30.

As illustrated in FIG. 2 the device package is positioned between second end portion 30 and face 41 but is not firmly held in place. The body 10 may be designed so that second end portion 30 either does not contact or only loosely contacts the device package 15 when in the open position of FIG. 2. Accordingly, the device package 15 can be readily and easily inserted by hand without use of special tools and without likelihood of physical damage to the package 15.

In order to finally secure device package 15, pressure is applied to urge first end portion 20 toward the base 40. When first end portion 20 is urged toward the support base 40, the body 10 pivots about central portion 11 constrained within aperture 45 and thus second end portion 30 is urged toward the opposite face 41 of support base 40. Second end portion 30 thus contacts electronic device package 15 and urges package 15 into intimate thermal contact with face 41 of support base 40. As further pressure is applied to first end portion 20, latching end 22 is forced into aperture 46 a sufficient distance to permit barb 23 to pass through aperture 46 and engage the opposite face 41 of base support 40, thus locking the body 10 in the position illustrated in FIG. 3 and trapping the package 15 between end portion 30 and face 41. It will be noted that as latching end 22 is forced into aperture 46, the body 10 is stressed and second end portion 30 acts as a spring clip which is secured to base 40 at central portion 11.

Since the body 10 can be inserted into apertures 45 and 46 by hand, and since the body 10 forms an open receptacle for the electronic device package when in the open position of FIG. 2, no tools are required to assemble the apparatus or to insert an electronic device package. Furthermore, since the device package is secured by forcing latching end 22 into aperture 46, pressure is applied to the device package only by second end portion 30 after the device package has been properly inserted. Risk of damage to the device package 15 is minimized since the pressure exerted on device package 15 is limited by the limited travel of first end portion 20. Thus it is impossible to exert pressure on the device package 10 which is in excess of the desired amount.

As shown in the drawing, the body 10 is particularly adapted to secure a device package 15 which has a thermal transfer pad 16 adjacent the face 41 of a typical heat sink. Although package 15 is representative of the TO-220 package, the invention is not so limited. The second end portion 30 may have a segment 31 particularly adapted to mate with and secure any desired package shape. Furthermore, second end 30 may include bosses, flanges or the like (not illustrated) which act as stops and/or alignment devices which are commonly used in conventional clip assemblies for securing device packages to heat sinks and the like. Similarly, second end portion 30 may be appropriately formed to accommodate more than one device package and/or device packages of various shapes and sizes.

While the invention has been described with particular reference to an assembly wherein the clip body 10 is used to secure an electronic device package to one face of the same base support in which the body 10 is anchored, the invention is not so limited. The principles of the invention are equally applicable to other arrangements such as securing the device package to another surface in fixed relation to the base 40. Accordingly, it is to be understood that although the invention has been described with particular reference to a specific embodiment, the form thereof shown and described in detail is to be taken as a preferred embodiment. Various changes and modifications may be resorted to without departing from the spirit and scope of the invention as defined by the appended claims.

What is claimed is:

1. Apparatus for securing an electronic device package in contact with a heat sink comprising:
   (a) a support member having a substantially flat base with substantially parallel opposite major faces and first and second apertures extending there through; and
   (b) a unitary elongated substantially rigid body having:
      (i) a first end portion and a second end portion connected by a central section;
      (2i) a substantially S-shaped curve in said central section extending through said first aperture in said support member so that said first end portion extends in a direction substantially parallel with one major face and the second end portion extends in substantially the opposite direction substantially parallel with and spaced from the opposite major face of the support member; and
      (3i) a bend in said first end portion defining a latching end which projects generally in the same direction as the center section of said S-shaped curve and in secured in the second aperture of the support member.

2. Apparatus as defined in claim 1 including a boss on said second end portion adjacent said substantially S-shaped curve.

3. Apparatus as defined in claim 1 including a first boss on said latching end between said bend and the free end of said latching end adapted to secure said latching end in said second aperture.

4. Apparatus as defined in claim 3 including a second boss on said latching end between said first boss and said free end of said latching end.

5. Mounting apparatus comprising
   a) support base having oppositely disposed first and second faces and first and second apertures therein; and
   b) a substantially rigid elongated member having first and second end portions joined by a central portion which passes through said first aperture and supporting said first and second end portions on opposite sides of said support base and substantially parallel with said oppositely disposed first and second faces and having a latching end extending from said first end portion and secured within said second aperture.

6. Apparatus as defined in claim 5 including a boss on said second end portion adjacent said central portion.

7. Apparatus as defined in claim 5 including a first boss on said latching end and wherein the free end of said latching end extends through said second aperture.

8. Apparatus as defined in claim 7 including a second boss on said latching end between said free end and said first boss.

9. In combination:
   (a) a heat sink;
   (b) a support base defining a substantially flat member with oppositely disposed first and second major faces lying in first and second substantially parallel planes and having first and second apertures therein;
   (c) a substantially rigid elongated body having first and second end portions joined by a central portion which is positioned within said first aperture and supports said first and said second end portions on opposite sides of said substantially flat member and having a latching end portion extending from said first end portion secured within said second aperture; and
   (d) an electronic device package secured between said second end portion and said heat sink.

10. The combination defined in claim 9 wherein said latching end portion extends through said second aperture.

11. The combination defined in claim 10 including means for selectively securing said latching end within said second aperture at first and second positions.

12. The combination defined in claim 9 wherein said support base is an integral part of said heat sink.

* * * * *

UNITED STATES PATENT AND TRADEMARK OFFICE
CERTIFICATE OF CORRECTION

PATENT NO. : 5,138,524

DATED : August 11, 1992

INVENTOR(S) : Matthew C. Smithers

It is certified that error appears in the above-indentified patent and that said Letters Patent is hereby corrected as shown below:

Column 2, line 66, "DRAWINGS" should read -- DRAWING --.

Column 3, line 26, after "11" insert a period (.)

Column 3, line 31, after "30" insert --- is ---.

Column 6, line 16, "comprising" should read --comprising:--.

Column 6, line 20, "b)" should read --(b) --.

Signed and Sealed this

Fourteenth Day of September, 1993

Attest:

BRUCE LEHMAN

*Attesting Officer*  *Commissioner of Patents and Trademarks*